(12) United States Patent
Ishikawa et al.

(10) Patent No.: US 6,781,873 B2
(45) Date of Patent: Aug. 24, 2004

(54) NON-VOLATILE MEMORY DEVICE CAPABLE OF GENERATING ACCURATE REFERENCE CURRENT FOR DETERMINATION

(75) Inventors: Masatoshi Ishikawa, Hyogo (JP); Hiroaki Tanizaki, Hyogo (JP)

(73) Assignees: Renesas Technology Corp., Tokyo (JP); Mitsubishi Electric Engineering Company Limited, Tokyo (JP)

(*) Notice: Subject to any disclaimer, the term of this patent is extended or adjusted under 35 U.S.C. 154(b) by 0 days.

(21) Appl. No.: 10/364,329

(22) Filed: Feb. 12, 2003

(65) Prior Publication Data

US 2004/0047216 A1 Mar. 11, 2004

(30) Foreign Application Priority Data

Sep. 5, 2002 (JP) ........................................ 2002-260128

(51) Int. Cl.[7] .............................................. G11C 11/15
(52) U.S. Cl. ...................... 365/158; 365/210; 365/209; 365/207; 365/206; 365/173; 365/171
(58) Field of Search ................................. 365/148, 173, 365/171, 158, 210, 209, 206, 207, 208, 190

(56) References Cited

U.S. PATENT DOCUMENTS

| 6,201,742 B1 | * | 3/2001 | Hirai et al. ............ 365/189.09 |
| 6,269,040 B1 | | 7/2001 | Reohr et al. ................. 365/210 |
| 6,317,376 B1 | | 11/2001 | Tran et al. ................... 365/210 |
| 6,388,932 B2 | * | 5/2002 | Kohno ......................... 365/210 |
| 6,538,940 B1 | * | 3/2003 | Nahas et al. ................. 365/201 |
| 6,597,601 B2 | * | 7/2003 | Ooishi ......................... 365/171 |

OTHER PUBLICATIONS

R. Scheuerien et al., "A 10ns Read and Write Non–Volatile Memory Array Using a Magnetic Tunnel Junction and FET Switch in Each Cell." ISSCC Digest of Thechnical Papers, TA7.2, Feb. 2000, pp. 94–95. 128–129, 409–410.
M. Durlam et al., "Nonvolatile RAM Based on Magnetic Tunnel Junction Elements." ISSCC Digest of Technical Papers, TA7.3, Feb. 2000, pp. 96–97, 130–131, 410–411.
P. Naji et al., "A 256kb 3.0V 1T1MTJ Nonvolatile Magnetoresistive RAM." ISSCC Digest of Technical Papers, TA7.6, Feb. 2001, pp. 122–123.

* cited by examiner

*Primary Examiner*—Andrew Q. Tran
(74) *Attorney, Agent, or Firm*—Burns, Doane, Swecker & Mathis, L.L.P.

(57) ABSTRACT

In a memory cell array of an MRAM, a reference memory cell holding a reference value can generate accurate reference current of an intermediate value of data by uniformly supplying reference current to two sense amplifiers using two cells of a cell holding "H" data and a cell holding "L" data. Each bit line is connected to a data-storing memory cell and to the reference memory cell. When the data-storing memory cell connected to a bit line is accessed, the reference memory cell is accessed on the adjacent bit line. Only one row of reference memory cells is provided, reducing the chip area. Therefore, a non-volatile memory device that can reduce the area of a reference cell occupied on a chip while generating accurate reference current for determination can be provided.

12 Claims, 16 Drawing Sheets

B-B

NON-VOLATILE MEMORY DEVICE CAPABLE OF GENERATING ACCURATE REFERENCE CURRENT FOR DETERMINATION

BACKGROUND OF THE INVENTION

1. Field of the Invention

The present invention relates to a non-volatile memory device, and more particularly, to an MRAM (Magnetic Random Access Memory).

2. Description of the Background Art

The MRAM is a memory using a magnetic body as a storage element. A phenomenon in which the resistance of a material changes depending on the direction of magnetization of the magnetic body is called an MR (Magneto Resistive) effect. The MR effect is further classified by operating principles. One of such called a TMR (Tunneling Magneto Resistive) phenomenon has been identified as having a high MR ratio (a resistance ratio by magnetization of the magnetic body), and a TMR element has been studied as an element for the MRAM.

The TMR phenomenon is such a phenomenon that the magnitude of tunneling current flowing through an insulation film interposed between magnetic bodies changes in accordance with the direction of electron spin determined by magnetization of the magnetic body.

FIG. 13 schematically shows a conventional thin film having a magnetic tunnel junction (MTJ) at which the TMR phenomenon occurs. The thin film is also referred to as an MTJ element or a tunneling magneto resistive (TMR) element.

Referring to FIG. 13, ferromagnetic films 701, 703 are arranged with an insulation film 702 interposed therebetween. Spin electrons within the magnetic bodies change their state in accordance with the direction of magnetization. Here, if magnetic film 701 has the same direction of magnetization as that of magnetic film 703, the tunneling current increases. By contrast, if the direction of magnetization of magnetic film 701 is opposite to that of magnetic film 703, the tunneling current decreases.

Using such a phenomenon, the direction of magnetization of magnetic film 701 is changed and the magnitude (resistance) of the tunneling current is detected, to allow the TMR element to be used as a storage element. Magnetic film 703 may have the direction of magnetization fixed by an antiferromagnetic body, which is called a spin valve.

In order to realize a high-density non-volatile memory device, memory cells are preferably arranged in a two-dimensional array. A ferromagnetic body has an easily-magnetized direction (low energy state) due to a crystal structure, a shape or the like, the direction being referred to as an easy axis. Magnetization of a storage element is held in a direction along the easy axis. By contrast, a hardly-magnetized direction is called a hard axis.

FIG. 14 shows an asteroid curve for illustrating reversal of magnetization.

Referring to FIG. 14, in order to reverse the direction of magnetization, a magnetic field is applied in a direction opposite to the present magnetization with respect to the easy axis to change the direction of magnetization of a storage element. It is known here that, if a magnetic field is applied in the direction of the hard axis, the direction of magnetization is reversed with a smaller magnetic filed in the direction of the easy axis compared to the case where no magnetic field applied in the direction of the hard axis. The asteroid curve shown in FIG. 14 illustrates the relationship between the magnitude of the magnetic field and the threshold for the reversal of magnetization in the directions of the easy axis and the hard axis.

FIG. 15 shows a two-dimensional arrangement of memory cells in the MRAM.

Referring to FIG. 15, a plurality of interconnection lines 801 are arranged orthogonal to a plurality of interconnection lines 802 arranged parallel to the X-axis. At each intersection of interconnection lines 801 and 802, a magnetic body 803 is interposed between interconnection lines 801 and 802.

If current is provided for a specific line selected from the lines in the X- and Y-directions, magnetization of magnetic body 803 is reversed only in memory cells located at intersections to which a magnetic filed is applied both in the hard and easy axis directions, allowing data rewriting. No magnetic filed exceeding the threshold value is applied to magnetic bodies in the other numerous memory cells, so that no rewriting occurs. Accordingly, writing to the two-dimensional memory array can be realized.

Data reading can be detected by, for example, a method of comparing tunneling current flowing in magnetic body 803 with a reference cell.

FIG. 16 schematically shows a conventional MRAM memory cell (for example, disclosed in the document by Roy, et al., which will be described later).

Referring to FIG. 16, a TMR element 852 in a spin valve form is used as a storage element of a memory cell. A transistor 855 is used as a switch element for reading.

As interconnection lines for transmitting signals, a bit line 851 used at the time of reading and writing, a word line 854 rendering transistor 855 conductive at reading, a digit line 853 providing current at writing, and a source line connected to the source of a transistor (not shown) are provided.

At writing, current is applied to digit line 853 and bit line 851 to generate a synthetic magnetic field at a cell position of interest so as to control the direction of magnetization of a magnetic body in the TMR element.

At reading, voltage is applied to word line 854, rendering transistor 855 conductive. Current is provided from bit line 851 to the source line via TMR element 852 and transistor 855. Here, the magnitude of the flowing current varies depending on the direction of spinning of the TMR element. This current is compared with the current flowing in the reference cell to determine that the data stored in the TMR element is either a logic high of "H" or a logic low of "L." Current flowing at the time of reading is considerably lower than the current flowing at the time of writing. Thus, data reading would not apply a magnetic field exceeding the threshold to the TMR element, so that the direction of magnetization of the magnetic body remains unchanged. Hence, the MRAM is capable of nondestructive read out.

It is noted that technical information for the MRAM are disclosed in the documents as follows:

Roy Scheuerlein, et al., "A 10 ns Read and Write Non-Volatile Memory Array Using a Magnetic Tunnel Junction and FET Switch in each Cell," ISSCC Digest of Technical Papers, February 2000, TA7.2;

M. Durlam, et al., "Nonvolatile RAM based on Magnetic Tunnel Junction Elements," ISSCC Digest of Technical Papers, February 2000, TA7.3, pp. 130–131;

U.S. Pat. No. 6,269,040 (FIG. 4A); and

U.S. Pat. No. 6,317,376.

In the MRAM, determination of data is performed by comparing a reference signal with a signal from a memory cell to be read out. U.S. Pat. No. 6,269,040 and U.S. Pat. No. 6,317,376 disclose that a plurality of reference memory cells are used to generate a reference signal. The TMR element, however, has such a characteristic that the resistance value changes in accordance with a voltage applied to the both ends thereof.

FIGS. 17 and 18 illustrate a problem occurring when a plurality of TMR elements are used as reference cells to produce a reference signal.

Referring to FIG. 17, in order to discriminate a memory cell storing "H" from a memory cell storing "L," an intermediate value between a current value IH and a current value IL is required as reference current.

Reference cell 871 stores data "H," whereas reference cell 872 stores data "L." A voltage V is applied to the both ends of reference cells 871, 872 connected in parallel, to provide current of IH+IL flowing as reference current Iref. Current with half the magnitude of the reference current is required as the reference value for data discrimination.

Even if the voltage applied to the both ends of the parallely connected reference memory cells 871, 872 is changed from voltage V to ½·V, reference current Irefa obtained here will not be half the value of IH+IL, as shown in FIG. 18. This is because the voltage applied to both ends of TMR element reduced to ½ would change the resistance value of the TMR element. Hence, a current value IHa will not be half the value of IH and current value ILa will not be half the value of current value IL.

FIG. 19 illustrates an example disclosed in U.S. Pat. No. 6,269,040 where a reference signal is produced by applying the same voltage to both ends of a TMR element in each of the reference cell and the memory cell to be read out.

Referring to FIG. 19, a row selection line 903 is selected and bit line 905 is connected to one input of a sense amplifier 901 by a switch SW1 of switches SW1 to SW6. In addition, a bit line 908 is connected to one input of a sense amplifier 902 by switch SW5.

Two reference columns 910, i.e. bit lines 906 and 907, are connected to the other input of sense amplifiers 910, 902 provided in common, by switches SW3, SW4, respectively. Here, the reference cell connected to bit line 906 holds a logic value "L," whereas the reference cell connected to bit line 907 holds a logic value "H."

Then, current flows as an averaged signal of the logic values "H" and "L" at the inputs of the sense amplifiers for the reference signal. This allows the logic values of memory cell X1 or memory cell X2 to be determined. The reference cell may be similar to a normal memory cell and may be read out as in the case with the normal memory cell, so that an accurate reference signal can advantageously be output.

In this system, however, two reference cell columns are required for each sub array, so that further reduction of the area occupied by the reference cell is desired. The reference memory cell may be provided outside the array, which may however cause a change in the characteristic depending on the locations of the cells within the memory array depending on variations in processes. This may increase the difference in characteristics between a memory cell and a reference cell, resulting in disadvantageous reading.

SUMMARY OF THE INVENTION

An object of the present invention is to provide a non-volatile memory device that can generate accurate reference current for determination while reducing the area on a chip occupied by reference cells.

According to an aspect of the present invention, a non-volatile memory device using a resistance element storing data in accordance with a change in a resistance value includes a memory array. The memory array includes a plurality of bit lines; a plurality of memory cells for storing externally-applied data, a plurality ones of the memory cells being connected to each of the bit lines; and a plurality of reference memory cells for holding a reference value for discriminating data to be read out from the plurality of memory cells, each of the reference memory cells being connected to each of the bit lines. The non-volatile memory device further includes a selection circuit selecting at least one of the plurality of memory cells as a selected cell in accordance with an input address, and selecting at least two of the plurality of reference memory cells connected to a bit line different from a bit line to which the selected cell is connected, as a plurality of selected reference cells corresponding to the selected cell, and a read control circuit performing detecting operation of read data of the selected cell in accordance with current flowing in the whole of the plurality of selected reference cells. The read control circuit equally holds a voltage applied to each of the plurality of selected reference cells and a voltage applied to the selected cell at the detecting operation.

A main advantage of the present invention is, therefore, that the area in a memory array occupied by reference memory cells can be reduced, since only one row of reference memory cells may be sufficient.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
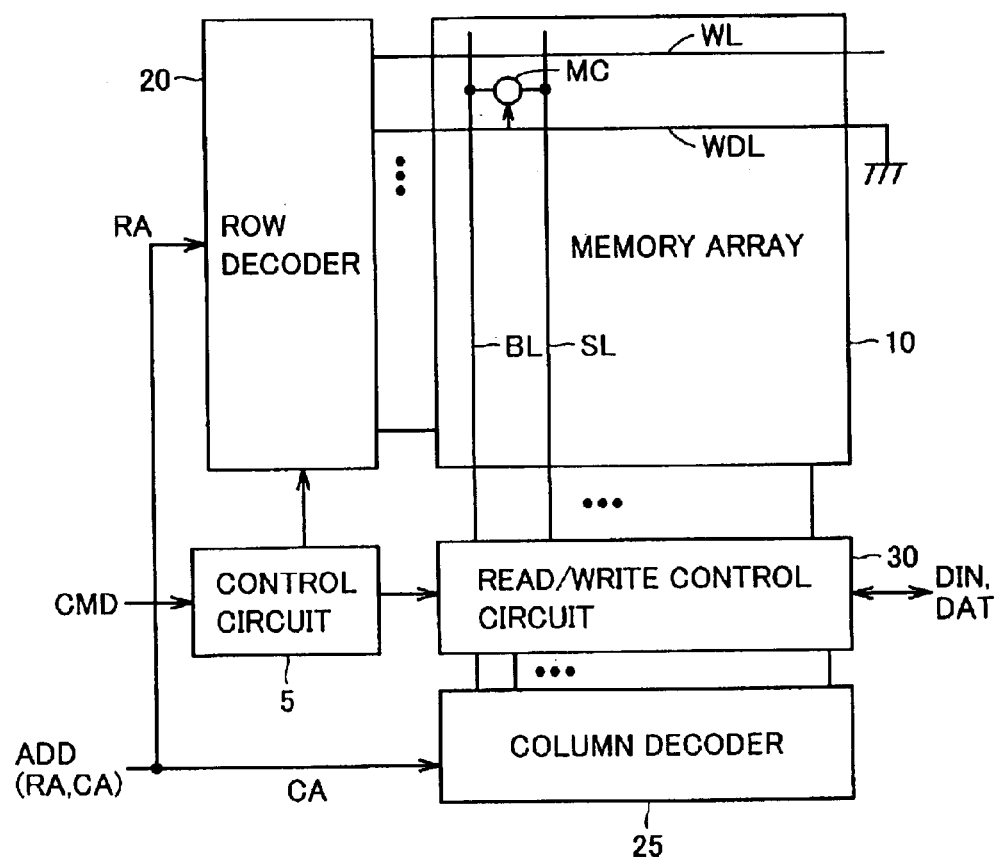
FIG. 1 is a schematic block diagram showing the configuration of a non-volatile memory device 1 according to the first embodiment of the present invention.

Embodiments of the present invention will be described below in detail with reference to the drawings. It is noted that the same or corresponding portions are denoted by the same reference characters in the drawings.

[First Embodiment]

FIG. 1 is a schematic block diagram showing the configuration of a non-volatile memory device 1 according to the first embodiment of the present invention.

Referring to FIG. 1, non-volatile memory device 1 performs random access in response to externally-applied control signal CMD and address signal ADD, to input write data DIN and to output read data DAT.

Non-volatile memory device 1 includes a control circuit 5 controlling the entire operation of non-volatile memory device 1 in accordance with control signal CMD, and a memory array 10 including MTJ memory cells MC arranged in a matrix of rows and columns.

In memory array 10, a word line WL and a write digit line WDL are arranged in correspondence to each row of the MTJ memory cells. Moreover, a bit line BL and a source line SL are arranged in correspondence to each column of MTJ memory cells MC. FIG. 1 representatively shows the arrangement of one MTJ memory cell MC, and word line WL, write digit line WDL, bit line BL and source line SL corresponding to that MTJ memory cell MC.

Non-volatile memory device 1 further includes a row decoder 20 decoding a row address RA indicated by an address signal to execute row selection in memory array 10, a column decoder 25 decoding a column address CA indicated by an address signal ADD to execute column selection in memory array 10, and a read/write control circuit 30.

Read/write control circuit 30 is a generic term of a circuit for applying data write current to bit line BL at data writing and a circuit for applying data read current to bit line BL at data reading. Read/write control circuit 30 receives write data DIN from the outside at data writing and outputs read data DAT to the outside at data reading.

Control circuit 5, row decoder 20, column decoder 25 and read/write control circuit 30 together form a selection control circuit in non-volatile memory device 1.

Figure 2:
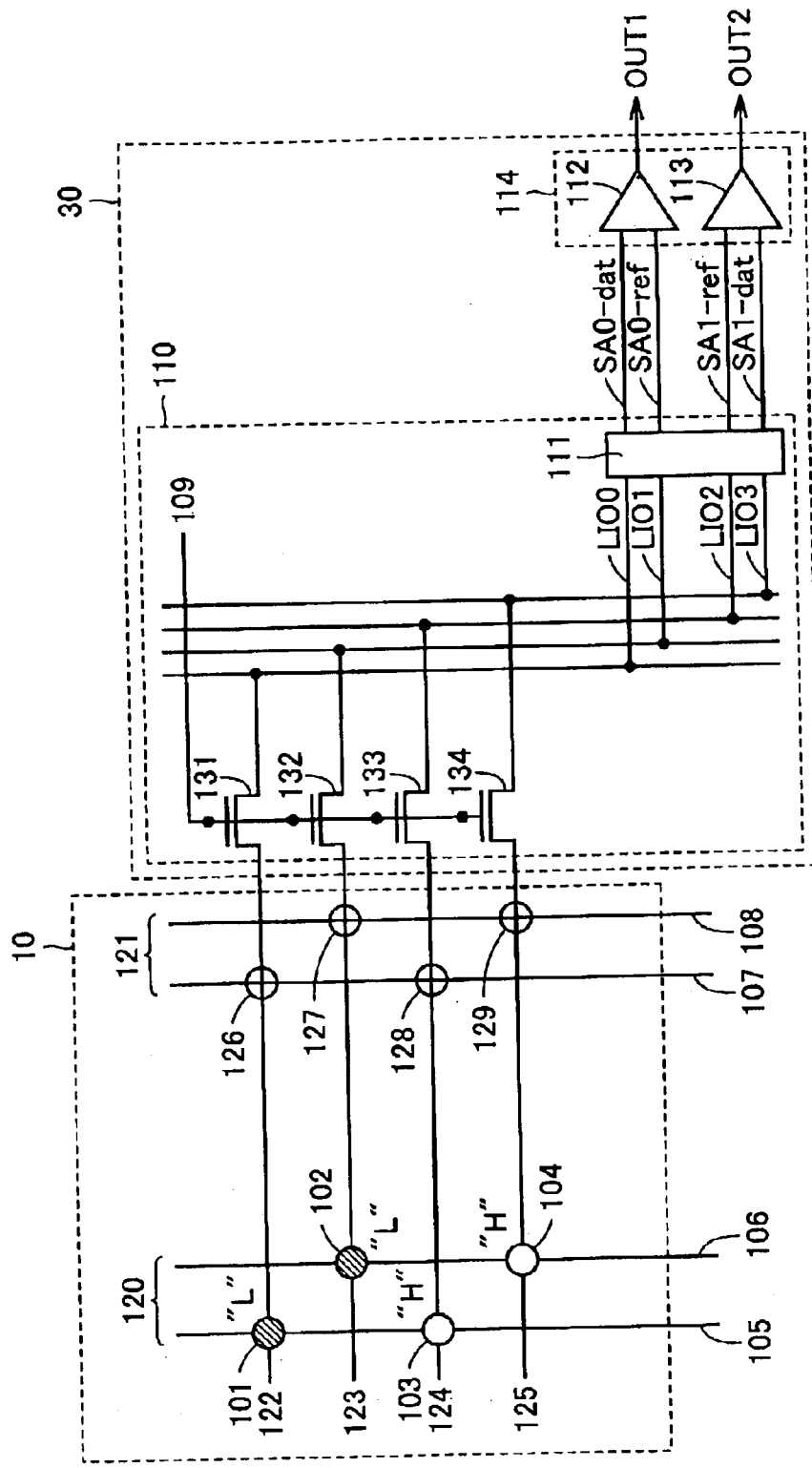
FIG. 2 shows the configuration of a memory array 10 and a read/write control circuit 30 shown in FIG. 1, concerning reading.

FIG. 2 shows the configuration of memory array 10 and read/write control circuit 30 in FIG. 1, concerning reading.

Referring to FIG. 2, memory array 10 includes a reference memory cell row 120 and a memory cell row 121. Reference memory cell row 120 includes reference memory cells 101, 102 holding the logic value "L" and reference memory cells 103, 104 holding the logic value "H." Memory cell row 121 includes memory cells 126 to 129 for storing externally-applied data. Though only one memory cell row 121 is shown here by way of illustration, it is not limited thereto, and memory cell 10 in fact includes a plurality of memory cells for storing data.

Reference memory cells 101 to 104 and memory cells 126 to 129 have the same structure, so that mass production is maintained without impairment of a repeating pattern of the memory array. If the repeating pattern of the memory array is impaired, a production step such as etching has partially different conditions, causing size variations of finished elements, which may prevent mass production.

Reference memory cells 101 to 104 are connected to two word lines and arranged in one row on a straight line, as will be described later. Likewise, memory cells 126 to 129 are also connected to two word lines and arranged in one row on a straight line, as will be described later.

Memory array 10 further includes a word line 105 for selecting reference memory cells 101, 103, a word line 106 for selecting reference memory cells 102, 104, a word line 107 for selecting memory cells 126, 128, and a word line 108 selecting memory cells 127, 129.

Memory cell array 10 further includes a bit line 122 connected to reference memory cell 101 and memory cell 126, a bit line 123 connected to reference memory cell 102 and memory cell 127, a bit line 124 connected to reference memory cell 103 and memory cell 128, and a bit line 125 connected to reference memory cell 104 and memory cell 129.

Read/write control circuit 30 includes a connecting portion 110 and an amplifying portion 114.

Connecting portion 110 includes a selection gate 131 connected between bit line 122 and an IO line LIO0 and having its gate connected to a column selection line 109, a selection gate 132 connected between bit line 123 and an IO line LIO1 and having its gate connected to column selection line 109, a selection gate 133 connected between bit line 124 and an IO line LIO2 and having its gate connected to column selection line 109, and a selection gate 134 connected between bit line 125 and IO line LIO3 and having its gate connected to column selection line 109.

Connecting portion 110 further includes a selector 111 for connecting IO lines LIO0–LIO3 to input nodes SA0-dat, SA0-ref, SA1-ref and SA1-dat of sense amplifiers.

Amplifying portion 114 includes a sense amplifier 112 amplifying the difference between current flowing at node SA0-dat and current flowing at node SA0-ref to output a signal OUT1, and a sense amplifier 113 amplifying the difference between current flowing at node SA1-ref and current flowing at node SA1-dat to output a signal OUT2.

Accordingly, in the memory array of the MRAM, a reference memory cell holding a reference value may generate accurate reference current of an intermediate value of data by supplying reference current equally to two sense amplifiers using two cells of the cell holding the "H" data and the cell holding the "L" data.

A memory cell for data storing and a reference memory cell are connected to each bit line. When the memory cell for data storing connected to the bit line is accessed, the reference memory cell is accessed in the adjacent bit line. As will be described later with reference FIG. 3, one row of memory cells is provided for two word lines, so that only one row of reference memory cells is required, reducing the chip area.

Figure 3:
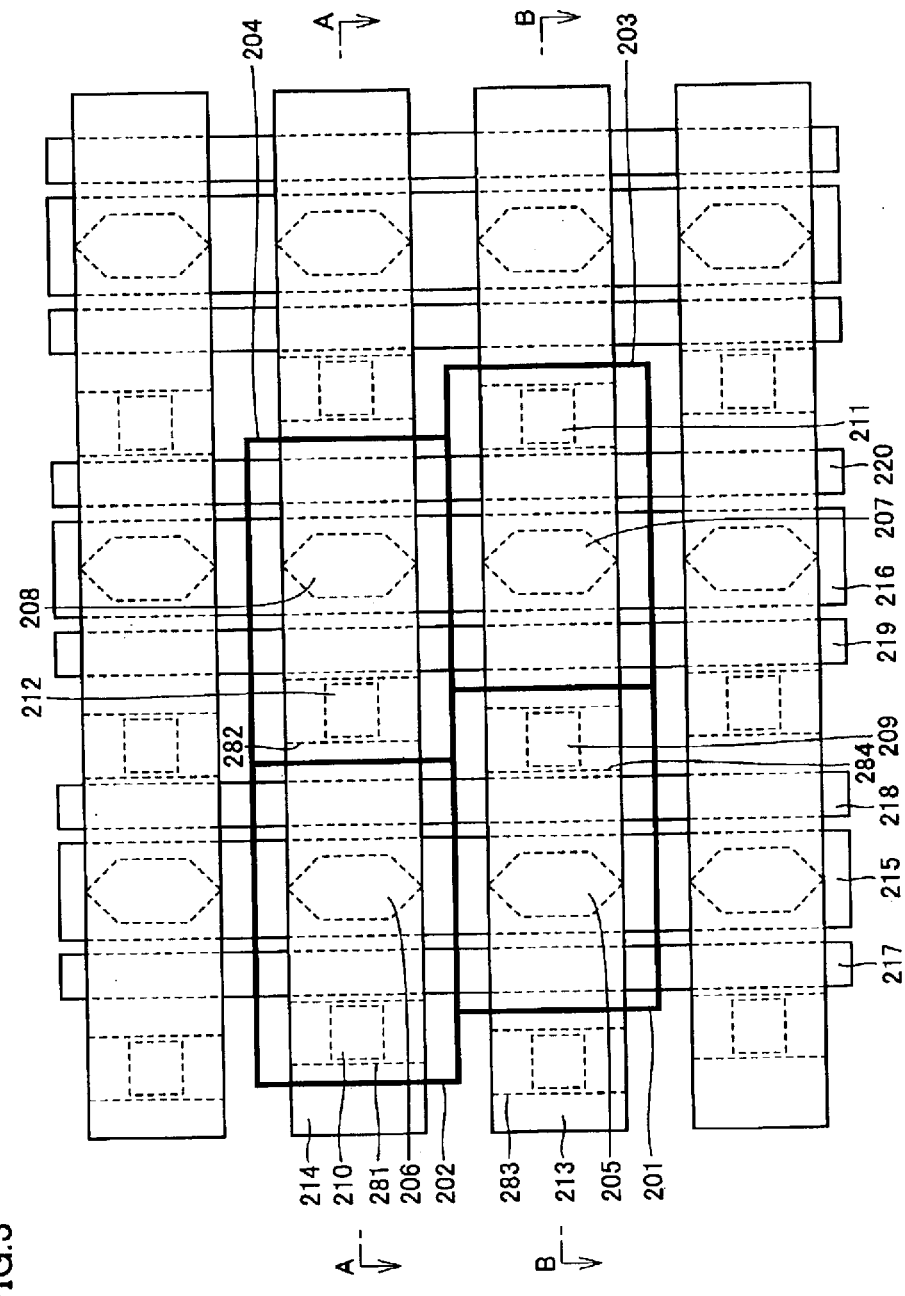
FIG. 3 is a plan view for illustrating a layout of memory cells in memory array 10 shown in FIG. 2.

FIG. 3 is a plan view for illustrating a layout of memory cells in memory array 10 shown in FIG. 2.

Referring to FIG. 3, bit lines 213, 214 are arranged in correspondence to memory cells 201 to 204. Digit lines 215, 216 are arranged orthogonal to bit lines 213, 214. Intersecting points of bit lines 213, 214 and digit lines 215, 216 are provided with TMR elements 205 to 208 as storage elements.

Word lines 217, 218 are arranged on both sides of and in parallel with digit line 215. Word lines 219, 220 are arranged on both sides of and in parallel with digit line 216. Word lines 217 to 220 are connected to the gates of transistors that are connected to TMR elements so as to be conductive at reading.

Two word lines are provided within a memory cell, one memory cell being provided with one read transistor which is to be a gate electrode of each word line, the read transistor being activated in response to activation of either one of the word lines. For instance, though two word lines 217, 218 pass through memory cell 201, only a region under word line 218 is used as a channel region of the transistor. Word line 217 is formed on an element isolation region, as will be described later, in memory cell 201.

In addition, the source region of the transistor is formed under a bit line, and is covered by the bit line in FIG. 3. The region between bit lines forms the element isolation region.

Figure 4:
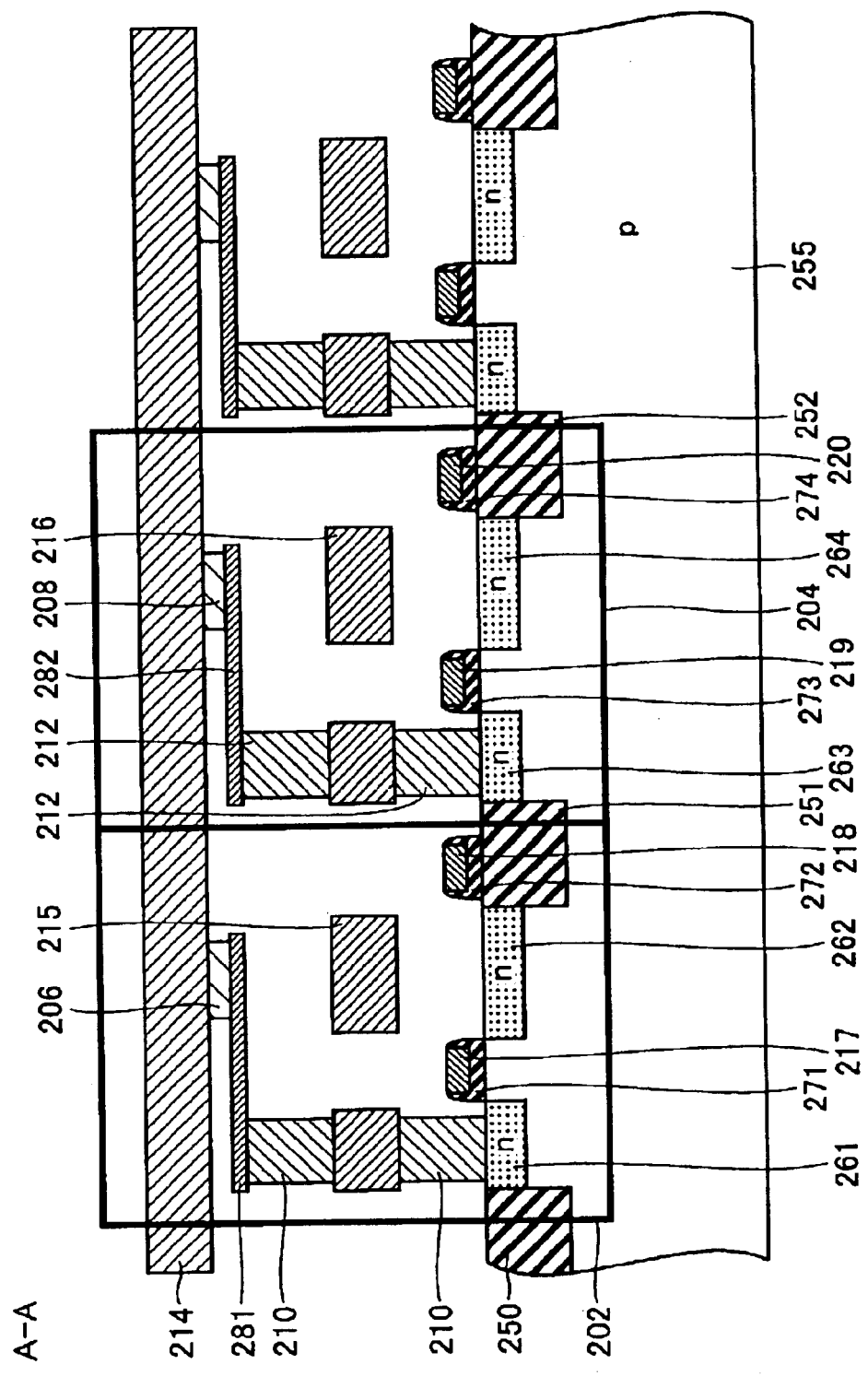
FIG. 4 is a section view taken along A—A in FIG. 3.

FIG. 4 is a section view taken along A—A in FIG. 3.

Referring to FIG. 4, insulation films 250 to 252 and n-type impurity regions 261 to 264 are formed on a main surface of a P substrate 255. A gate oxide film 271 is formed above a region between n-type impurity regions 261 and 262, and word line 217 which is to be a gate electrode is formed on gate oxide film 271. Word line 217 is formed by e.g. polysilicon.

Word line 218 is formed on insulation film 251. A gate oxide film 273 is formed above a region between n-type impurity regions 263 and 264, and word line 219 is formed on gate oxide film 273. Word line 220 is formed on insulation film 252.

Digit line 215 is formed above a region between word lines 217 and 218. Digit line 216 is formed above a region between word lines 219 and 220. A contact hole is provided at an interlayer insulation film arranged above n-type impurity region 261, a conductive plug 210 being provided in the contact hole. Likewise, a contact hole is provided at an insulation film above n-type impurity region 263, a conductive plug 212 being formed therein. Metal interconnection lines 281,282 are provided above plugs 210, 212, respectively. TMR elements 206, 208 are provided above metal interconnection lines 281, 282, respectively, and a bit line 214 is formed on TMR elements 206, 208, connected to the elements in common. It is noted that metal interconnection lines 281, 282 are arranged hidden under bit line 214 in FIG. 3.

Figure 5:
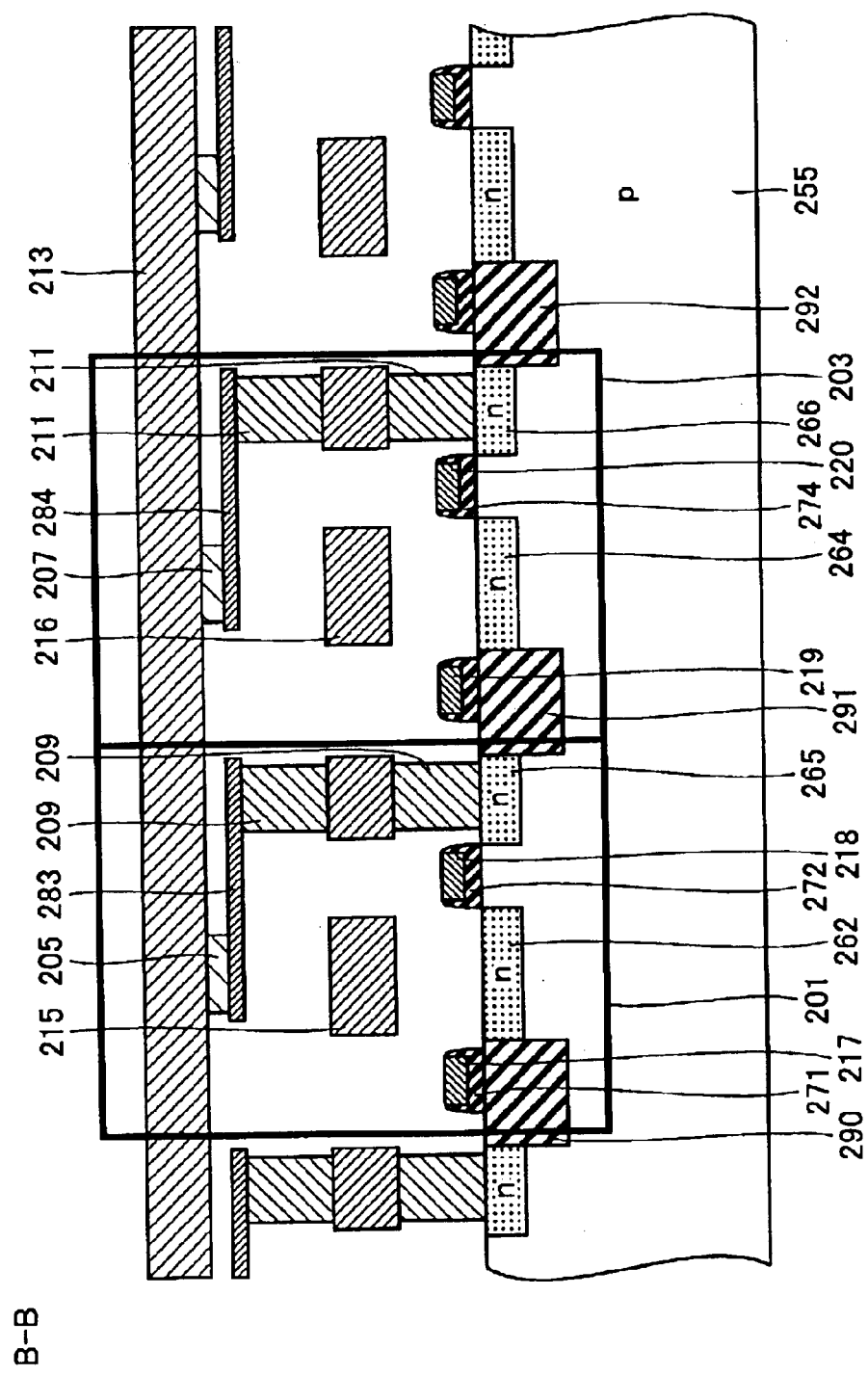
FIG. 5 is a section view taken along B—B in FIG. 3.

FIG. 5 is a section view showing the structure of a section taken along B—B in FIG. 3.

Referring to FIG. 5, insulation films 290 to 292, n-type impurity regions 262, 264 to 266 are formed on the main surface of P substrate 255. A gate oxide film 272 is formed above a region between n-type impurity regions 262 and 265, and word line 218 that is to be a gate electrode is formed on gate oxide film 272. Word line 217 is formed of e.g. polysilicon.

Word line 217 is formed on insulation film 290. Gate oxide film 274 is formed above a region between n-type impurity regions 264 and 266, and word line 220 is formed on gate oxide film 274. Word line 219 is formed on insulation film 291.

Digit line 215 is formed above a region between word lines 217 and 218. Digit line 216 is formed above a region between word lines 219 and 220. A contact hole is provided at an interlayer insulation film above n-type impurity region 265, conductive plug 209 being formed therein. Likewise, a contact hole is provided at an insulation film above n-type impurity region 266, conductive plug 211 being formed therein. Metal interconnection lines 283, 284 are provided above plugs 209, 211, respectively. TMR elements 206, 208 are provided above metal interconnection lines 283, 284, respectively, bit line 213 is formed on TMR elements 206, 208, connected to the elements in common. It is noted that metal interconnection lines 283, 284 are arranged hidden under bit line 213 in FIG. 3.

Figure 6:
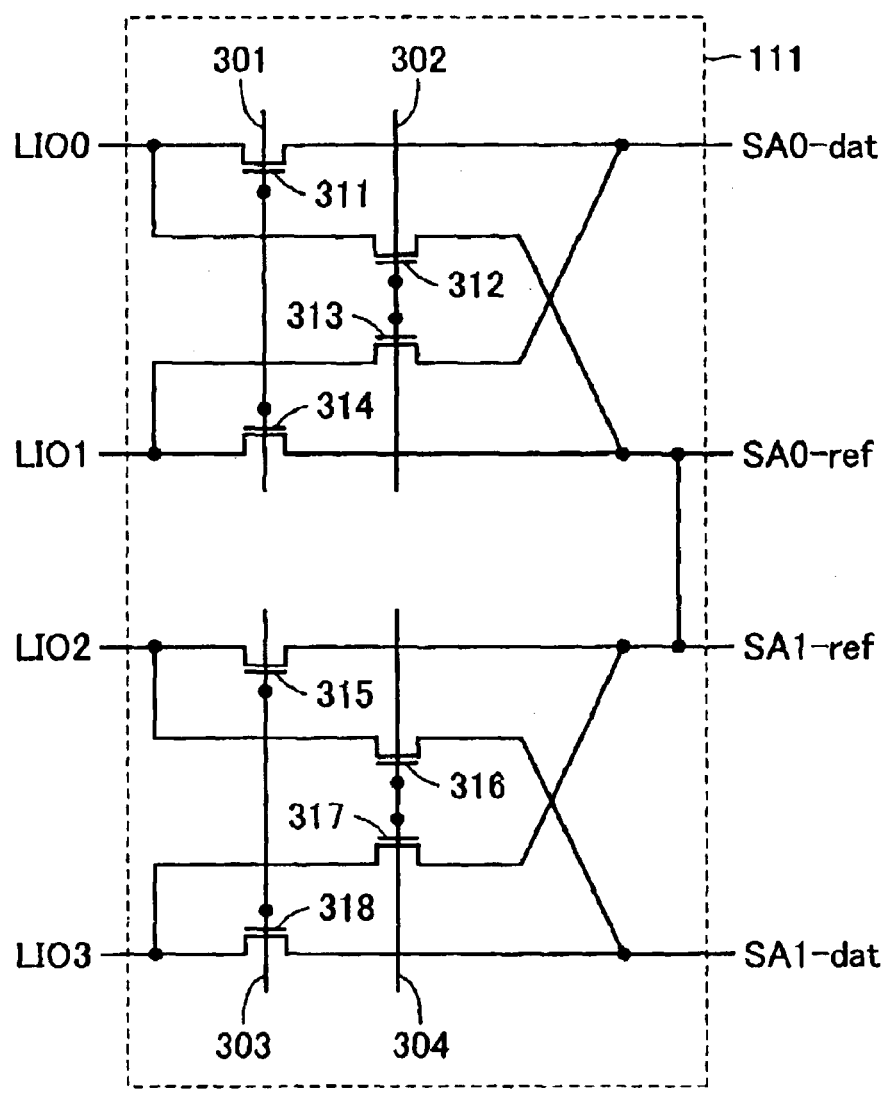
FIG. 6 is a circuit diagram showing the configuration of a selector 111 shown in FIG. 2.

FIG. 6 is a circuit diagram showing the configuration of selector 111 in FIG. 2.

Referring to FIG. 6, selector 111 includes a selection gate 311 connected between IO line LIO0 and node SA0-dat and having its control electrode connected to a selection line 301, a selection gate 312 connected between IO line LIO0 and node SA0-ref and having its control electrode connected to a selection line 302, a selection gate 313 connected between IO line LIO1 and node SA0-dat and having its control electrode connected to selection line 302, and a selection gate 314 connected between IO line LIO1 and node SA0-ref and having its control electrode connected to selection line 301.

Selector 111 further includes a selection gate 315 connected between IO line LIO2 and node SA1-ref and having its control electrode connected to a selection line 303, a selection gate 316 connected between IO line LIO2 and node SA1-dat and having its control electrode connected to a selection line 304, a selection gate 317 connected between IO line LIO3 and node SA1-ref and having its control electrode connected to selection line 304, and a selection gate 318 connected between IO line LIO3 and node SA1-dat and having its control electrode connected to selection line 303.

Node SA0-dat is one input node of sense amplifier 112 in FIG. 2, whereas node SA0-ref is the other input node of sense amplifier 112. Node SA1-ref is one input node of sense amplifier 113 in FIG. 2, whereas node SA1-dat is the other input node of sense amplifier 113. Node SA0-ref and node SA1-ref are electrically connected to each other within selector 111.

Referring to FIGS. 2 and 6, reading operation will be described. A reference cell holds the logic value "H" or "L." Here, reference memory cells 101, 102 holding the logic value "L" and reference memory cells 103, 104 holding the logic value "H" are shown.

When data held in memory cells 126, 128 are read out, word line 106 is activated simultaneously with word line 107. Column selection line 109 is activated such that a constant voltage is applied to a bit line. Then, current passing through cells 101, 127, 103 and 129 flow on IO lines LIO0, LIO1, LIO2 and LIO3 via bit lines 122, 123, 124 and 125, respectively. Here, selection line 301 and selection line 304 in selector 111 shown in FIG. 6 are activated.

Then, reference memory cell 102 holding the "L" data is connected to node SA0-ref, while reference memory cell 104 holding the "H" data is connected to node SA1-ref. Moreover, memory cell 126 is connected to node SA0-dat, whereas memory cell 128 is connected to node SA0-dat.

Here, node SA0-ref is electrically connected tp node SA1-ref within selector 111, so that current flows at reference signal nodes SA0-ref, SA1-ref of the sense amplifier, having a value obtained by averaging the current value in the case where the memory cell holds the "H" data and the current value in the case where the memory cell holds the "L" data, details of which will be described later. Accordingly, amplification of the difference between the current values allows determination of data held in memory cells 126, 128.

Likewise, when data held in memory cells 127, 129 are read out, word line 105 is activated simultaneously with word line 108. Column selection line 109 is then activated such that a constant voltage is applied to a bit line. Current passing through cells 101, 127, 103 and 129 flow on IO lines LIO0, LIO1, LIO2 and LIO3 via bit lines 122, 123, 124 and 125. Here, selection lines 302 and 303 of selector 111 in FIG. 6 are activated.

Reference memory cell 101 holding the "L" data is connected to node SA0-ref, whereas reference memory cell 103 holding the "H" data is connected to node SA1-ref. Likewise, memory cell 127 is connected to node SA0-dat, whereas memory cell 129 is connected to node SA0-dat. Here, node SA0-ref is electrically connected to node SA1-ref within selector 111, so that current having a value obtained by averaging a current value in the case where the memory cell holds the "H" data and a current value in the case where the memory cell holds the "L" data flows at reference signal nodes of a sense amplifier, as will be described later in detail. Accordingly, amplification of the difference between the current values allows determination of data held in memory cells 127, 129.

Selection of selection lines 301 to 304 in selector 111 is related to selection of a word line within memory array 10. When word line 105 is selected in reference memory cell row 120, selection lines 302, 303 are selected in selector 111. When word line 106 is selected in reference memory cell row 120, selection lines 301, 304 are selected in selector 111.

Figure 7:
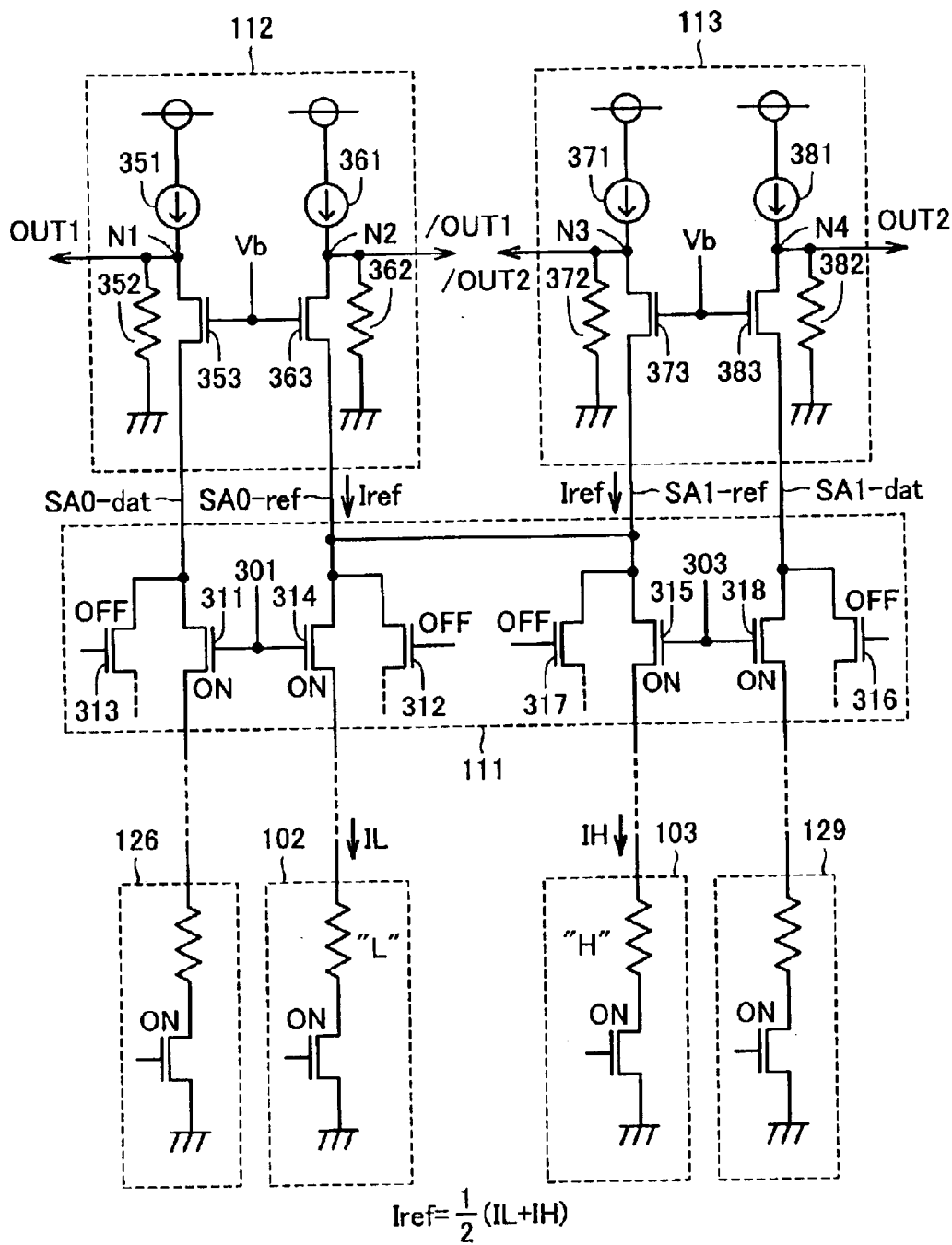
FIG. 7 is a circuit diagram illustrating determination operation of sense amplifiers 112, 113 shown in FIG. 2.

FIG. 7 is a circuit diagram for illustrating determination operation of sense amplifiers 112, 113 in FIG. 2.

Referring to FIG. 7, sense amplifier 112 includes a constant current source 351 connected between a node to which a power-supply voltage is applied and node N1, a resistance 352 connected between node N1 and a ground node, and an N-channel MOS transistor 353 connected between node N1 and input node SA0-dat. The gate of N-channel MOS transistor 353 is supplied with a bias potential Vb. An output signal OUT 1 is output from node N1.

Sense amplifier 112 further includes a constant current source 361 connected between a node to which the power-supply voltage is applied and a node N2, a resistance 362 connected between node N2 and the ground node, and an N-channel MOS transistor 363 connected between node N2 and input node SA0-ref. The gate of N-channel MOS transistor 363 is supplied with bias potential Vb. An output signal /OUT 1 is output from node N2.

Sense amplifier 113 includes a constant current source 371 connected between the node to which the power-supply voltage is applied and a node N3, a resistance 372 connected between node N3 and the ground node, and an N-channel MOS transistor 373 connected between node N3 and input node SA1-ref. The gate of N-channel MOS transistor 373 is supplied with bias potential Vb. An output signal /OUT2 is output from node N3.

Sense amplifier 113 further includes a constant current source 381 connected between the node to which the power-supply voltage is applied and a node N4, a resistance 382 connected between node N4 and the ground node, and an N-channel MOS transistor 383 connected between node N4 and input node SA1-dat. The gate of N-channel MOS transistor 383 is supplied with bias potential Vb. An output signal OUT2 is output from node N4.

The gates of N-channel MOS transistors 353, 363 are supplied with bias potential Vb so as to maintain the potentials of nodes SA0-dat and SA0-ref at a certain value. Thus, voltage of the same value is applied to memory cell 126 and to reference memory cell 102.

Likewise, the gates of N-channel MOS transistors 373, 383 are supplied with bias potential Vb so as to keep the potentials of nodes SA1-ref, SA1-dat at a constant value, allowing voltage of the same value to be applied to memory cell 129 and to reference memory cell 103.

In selector 111, selection lines 301, 303 are selected to render selection gates 311, 314, 315 and 318 conductive, while rendering selection gates 313, 312, 317 and 316 non-conductive.

Here, current value IL corresponding to "L" flows in reference memory cell 102, while current value IH corresponding to the "H" data flows in reference memory cell 103. Because of the symmetrical structure of sense amplifiers 112 and 113, the same current, i.e. reference current Iref, flows at nodes SA0-ref and SA1-ref electrically connected with each other. Thus, current value IL+IH is equal to twice the reference current Iref. That is, reference current Iref is obtained by the equation below.

$$Iref = \tfrac{1}{2} \cdot (IL + IH)$$

As has been described above, according to the first embodiment, one row of reference cells is used to generate highly accurate reference cell current. Moreover, a folded bit line structure is employed to achieve high resistance to noise.

[Second Embodiment]

Figure 8:
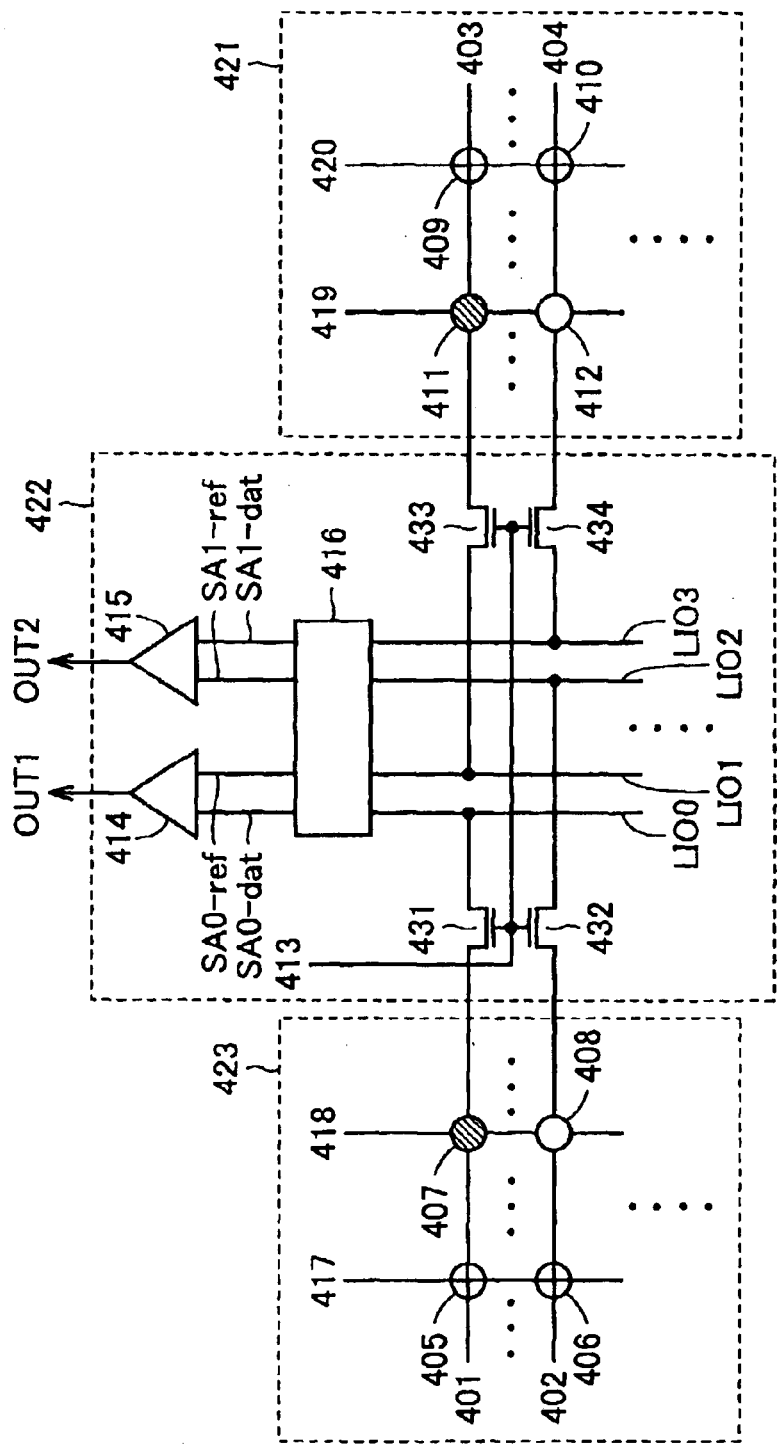
FIG. 8 is a circuit diagram for illustrating a memory array according to the second embodiment.

FIG. 8 is a circuit diagram for illustrating a memory array according to the second embodiment.

Referring to FIG. 8, a non-volatile memory device according to the second embodiment includes memory arrays 423, 421 and a read/write control circuit 422.

Memory array 423 includes memory cells 405, 406 for storing externally-applied data, a reference memory cell 907 holding the "L" data, and a reference memory cell 408 holding the "H" data.

Memory array 423 further includes a word line 417 for selecting memory cells 405, 406, and a word line 418 for selecting reference memory cells 407, 408.

Memory array 423 further includes a bit line 401 connected to memory cell 405 and reference memory cell 407, and a bit line 402 connected to memory cell 406 and reference memory cell 408.

Memory array 421 includes memory cells 409, 410 for storing externally-applied data, a reference memory cell 911 holding "L" data and reference memory cell 412 holding "H" data.

Memory array 421 further includes a word line 420 for selecting memory cells 409, 410 and a word line 419 for selecting reference memory cells 411, 412.

Memory array 423 further includes a bit line 403 connected to memory cell 409 and reference memory cell 411, and a bit line 404 connected to memory cell 410 and reference memory cell 412.

Though FIG. 8 is simplified by way of illustration, a number of memory cells are typically connected to bit lines 401 to 404.

Read/write control circuit 422 includes a selection gate 431 connected between bit line 401 and IO line LIO0 and having its control electrode connected to a column selection line 413, a selection gate 432 connected between bit line 402 and IO line LIO2 and having its control electrode connected to column selection line 413, a selection gate 433 connected between bit line 403 and IO line LIO1 and having its control electrode connected to column selection line 413, and selection gate 434 connected between bit line 404 and IO line LIO3 and having its control gate connected to column selection line 413.

Read/write control circuit 422 further includes a sense amplifier 415 detecting the difference between current flowing through input nodes SA0-dat and SA0-ref to output signal OUT1, and a sense amplifier 415 detecting the difference between current flowing through input nodes SA1-ref and SA1-dat to output signal OUT2.

Read/write control circuit 422 further includes a selector 416 selecting connection between IO lines LIO0 to LIO3 and nodes SA0-dat, SA0-ref, SA1-ref, SA1-dat. Selector 416 has a configuration similar to that of selector 111 as described with reference to FIG. 6, so that the description thereof will not be repeated. Sense amplifiers 414, 415 have a configuration similar to that of sense amplifiers 112, 113 as described with reference to FIG. 7, so that description thereof will not be repeated.

Figure 9:
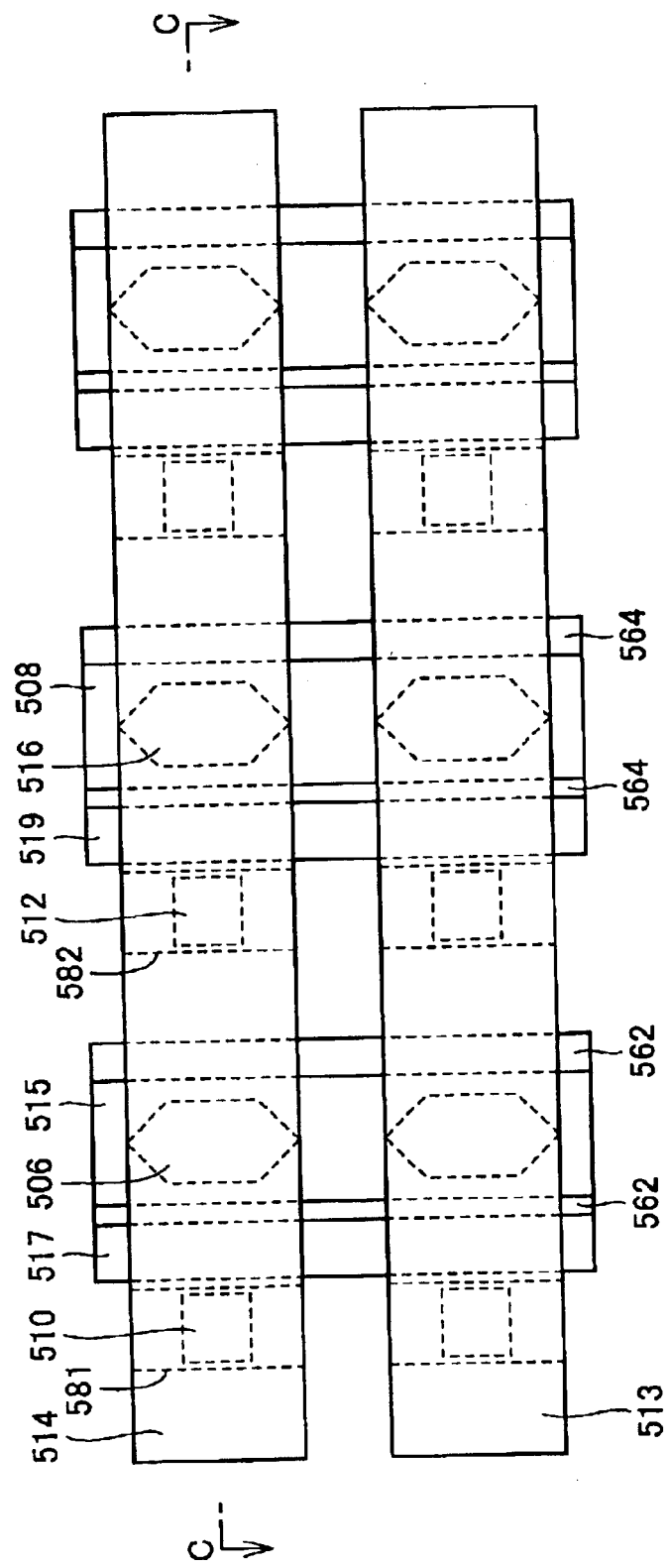
FIG. 9 is a plan view showing an arrangement of the memory array according to the second embodiment.

FIG. 9 is a plan view showing arrangement of the memory array according to the second embodiment of the present invention.

Referring to FIG. 9, a word line 517 activated at reading is provided orthogonal to bit lines 513, 514. A band-like n-type impurity region 562 is arranged adjacent to word line 517, forming a source line. A digit line 515 is so provided as to overlap with n-type impurity region 562. Under each bit line, a TMR element 506 and a conductive plug 510 within a contact hole for connection to the drain of a transistor for reading.

A word line 519 activated at reading is further provided orthogonal to bit lines 513, 514. A band-like n-type impurity region 564 is arranged adjacent to word line 519, forming a source line. A digit line 516 is so provided as to overlap with n-type impurity region 564. Under each bit line, a TMR element 508 and a conductive plug 512 within a contact hole for connection to the drain of a transistor for reading are provided.

Figure 10:
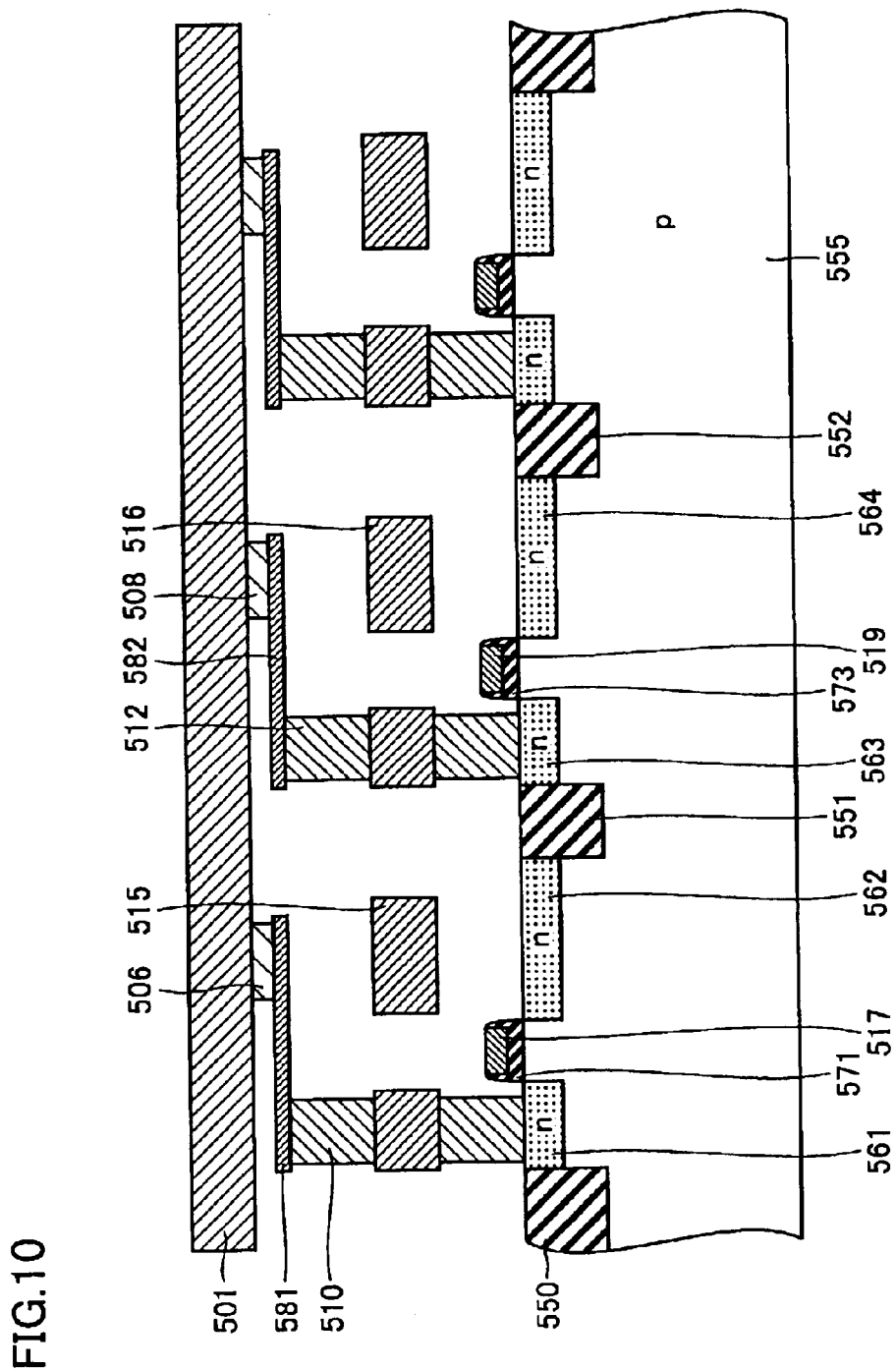
FIG. 10 is a section view showing the structure taken along C—C in FIG. 9.

FIG. 10 is a section view showing the structure of a section taken along C—C in FIG. 9.

Referring to FIG. 10, insulation films 550 to 552 for isolating elements from one another and n-type impurity regions 561 to 564 are formed on the main surface of P-substrate 555. A gate oxide film 571 is formed above a region between n-type impurity regions 561 and 562, and a word line 517 that is to be a gate electrode is formed on gate oxide film 571. A gate oxide film 573 is formed above a region between n-type impurity regions 563 and 564, and word line 519 is formed on gate oxide film 573. Word lines 517 and 519 are formed of e.g. polysilicon.

Digit lines 515, 516 are formed above word lines 517, 519. A contact hole is provided at an interlayer insulation film above n-type impurity region 561, and a conductive plug 510 is provided therein. Likewise, a contact hole is provided at an insulation film above n-type impurity region 563, and a conductive plug 512 is formed therein. Metal interconnection lines 581, 582 are provided above plugs 510, 512, respectively. TMR elements 506, 508 are provided above metal interconnection lines 581, 582, respectively, bit line 501 connected thereto in common being formed on TMR elements 506, 508. It is noted that metal interconnection lines 581, 582 are arranged hidden under bit line 514 in FIG. 9.

Referring again to FIG. 8, bit lines are arranged on both sides of IO lines LIO0 to LIO3 in a direction orthogonal to the IO lines. Such a structure that a pair of bit lines connected to a sense amplifier are arranged on both sides of the IO lines is called an open bit line structure. Though the drawing is simplified by way of illustration, typically, a number of bit lines are connected to the IO lines. Each memory cell has one word line which serves as the gate of a switch transistor that is conductive at reading.

When data held in memory cells 405, 406 are read out, word line 417 and word line 419 are activated. Word line 417 and word line 419 belong to memory arrays on the opposite sides with IO lines LIO0 to LIO3 interposed in between. If column selection line 413 is activated to apply voltage to a bit line, current corresponding to the resistance of each memory cell flows on IO lines LIO0 to LIO3 via the bit line. Here, selector 416 has a configuration similar to that of selector 111 as described with reference to FIG. 6, in which selection lines 301 and 304 are activated.

Current of an averaged value of the current flowing in reference cells 411 and 412 flows both at input nodes SA0-ref and SA1-ref. Current flowing through memory cells 405, 406 flow at input nodes SA0-dat, SA1-dat respectively. Accordingly, a reference signal has an intermediate value of the current value in the case where the "H" data is held and the current value in the case where the "L" data is held, allowing determination of data in the memory cells. It is noted that current flows through reference memory cells 407, 408 to similarly read the data held in memory cells 409, 410.

Connection of nodes within selector 416 depends on whether a memory cell to be read out is located in a region arranged on one side of the IO line or the other. According to the second embodiment, when data in a memory cell arranged in array 423 on the left side of IO lines LIO0 to LIO3, selection lines 301, 304 in selector 416 are activated. By contrast, when data of a memory cell in memory array 421 on the right side of IO lines LIO0 to L1O3, selection lines 302, 303 in selector 416 are selected.

In the second embodiment, only one word line, i.e. transistor gate, is provided passing through each memory cell, so that the gate pitch can be increased, allowing improvement in yield and cost reduction by reduced cells.

[Third Embodiment]

While "H" or "L" data was held in a reference memory cell in the first and second embodiments, another technique may also be used in that one of the logic values is held in a cell element itself and current passing through the reference memory cell is set as current IM corresponding to an intermediate value between the "H" data and the "L" data.

Figure 11:
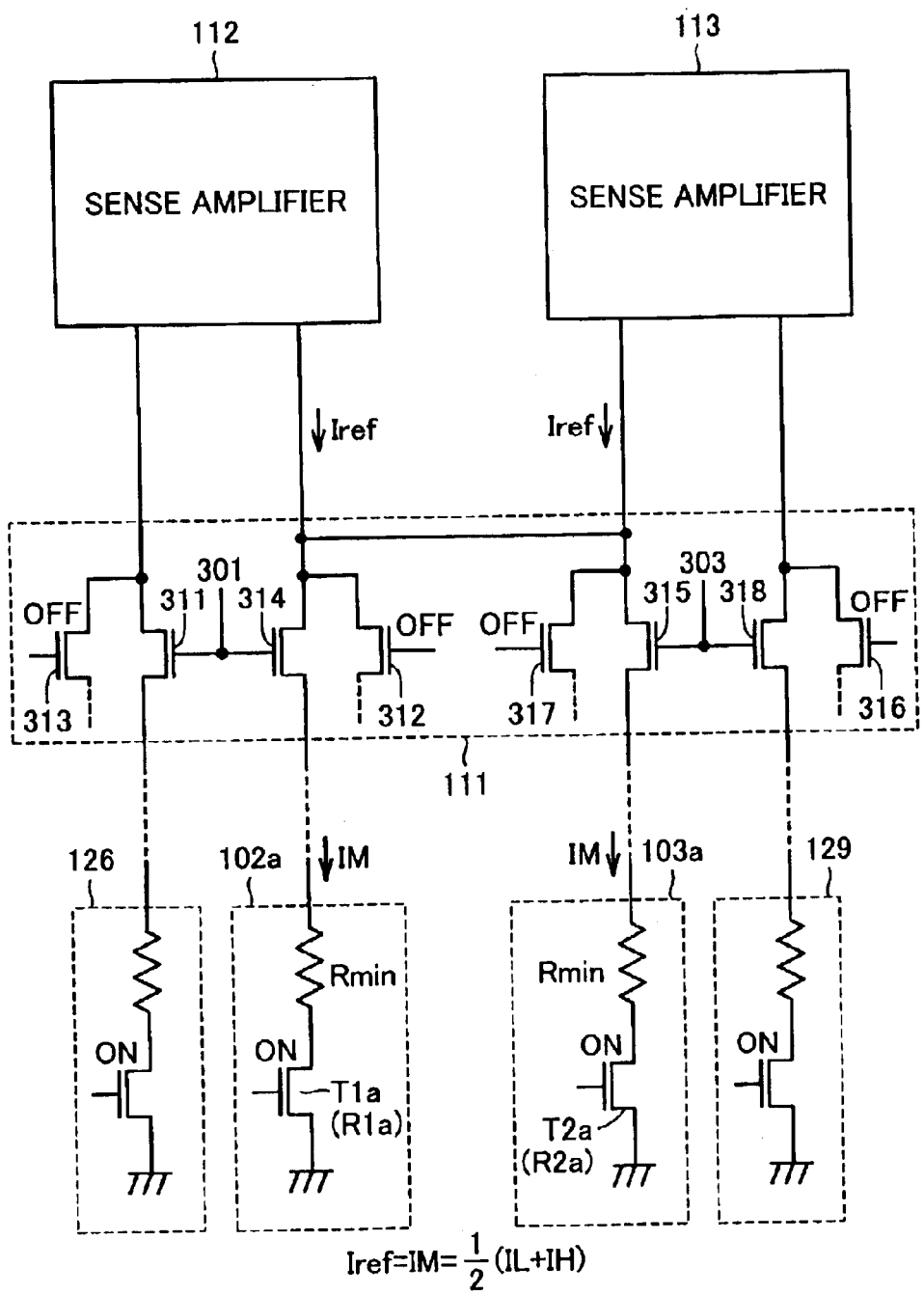
FIG. 11 illustrates application of current IM to reference cells with an equal set value of TMR elements of the reference cells.

FIG. 11 illustrates an example where TMR elements in the reference cells have the same set value and current IM is supplied to the reference cells.

Referring to FIG. 11, this can be achieved by adjusting the gate width or the gate length such that transistors T1a, T2a of reference memory cells 102a, 103a have conduction resistances R1a, R2a different from those of the other memory cells.

For instance, the size of TMR elements in reference memory cells 102a, 103a is made to be the same as that in data-storing memory cells 126, 129. Then, the gates of transistors T1a, T2a are made narrower than those of the transistors within storing memory cells 126, 129. If the same data is held in the TMR elements, the resistance values of reference memory cells 102a, 103a are larger than those of data-storing memory cells 126, 129. Thereafter, data corresponding to a resistance Rmin of a TMR element is written into both reference memory cells 102a and 103a. At that time, each resistance value of reference memory cells 102a, 103a is set at an intermediate value by adjusting respective values of R1a, R2a in advance. The intermediate value is preferably an average of the resistance value obtained when "H" data is held in the data-storing memory cell and the resistance value obtained when "L" data is held in the data-storing memory cell. Here, current IM flows in the reference memory cell. This current is half the value of IH+IL.

It is noted that the technique of adjusting the resistance value of a reference memory cell is not limited to narrowing of the gate of a transistor. Any other techniques may be employed that increases the resistance value of an element present in a path through which current flows at reading or that adds a resistance element in a memory cell. For instance, the gate length of the transistor may be increased or a resistance of an impurity region may be inserted in series with the transistor.

This also allows reference current Iref to be an intermediate value between the current value obtained when "H" data is held in the data-storing memory cell and the current value obtained when "L" is held therein. Here, only one type of the logic values may be used that is to be stored into a resistance element in a reference memory cell.

[Fourth Embodiment]

While the "H" or "L" data was held in a reference memory cell in the first and second embodiments, another technique may also be employed in that one of the logic values is held in a cell element itself and only the flowing current is set as current corresponding to the "H" or "L" data in the memory cell.

Figure 12:
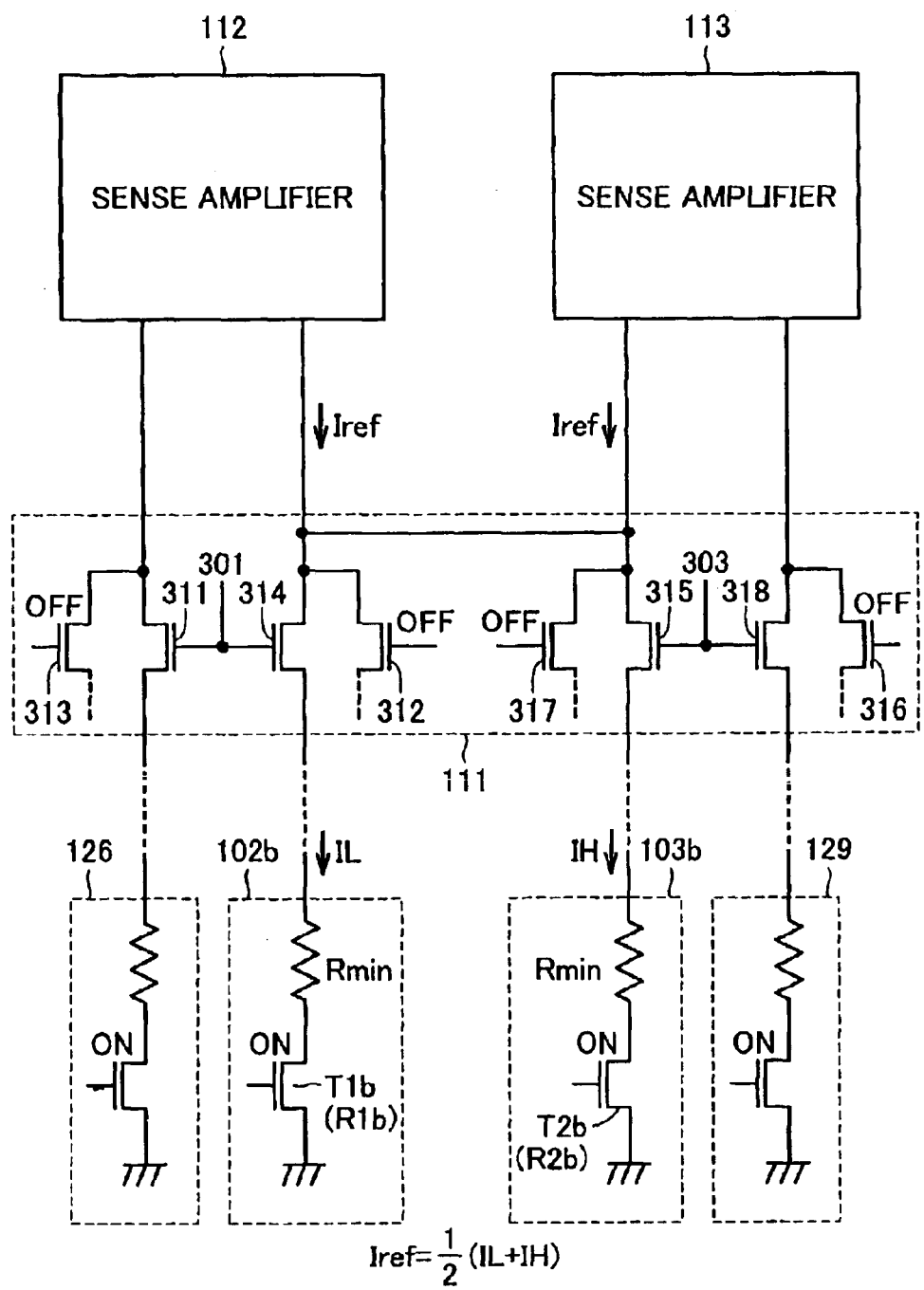
FIG. 12 illustrates application of current IH, IL to reference cells with an equal set value of TMR elements of the reference cells.
Figure 13:
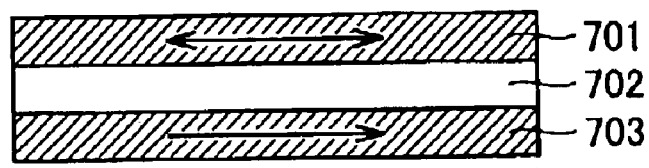
FIG. 13 schematically shows a thin film having magnetic tunnel junction in which a TMR phenomenon occurs.
Figure 14:
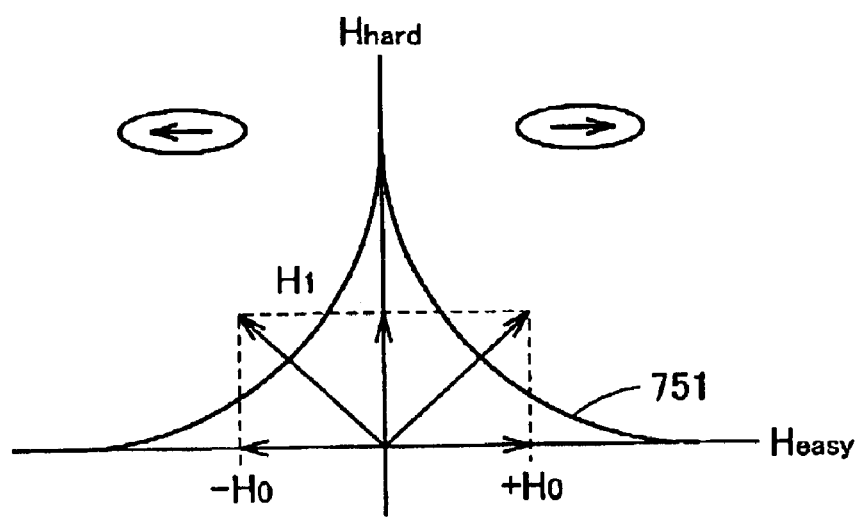
FIG. 14 shows an asteroid curve for illustrating reversal of magnetization.
Figure 15:
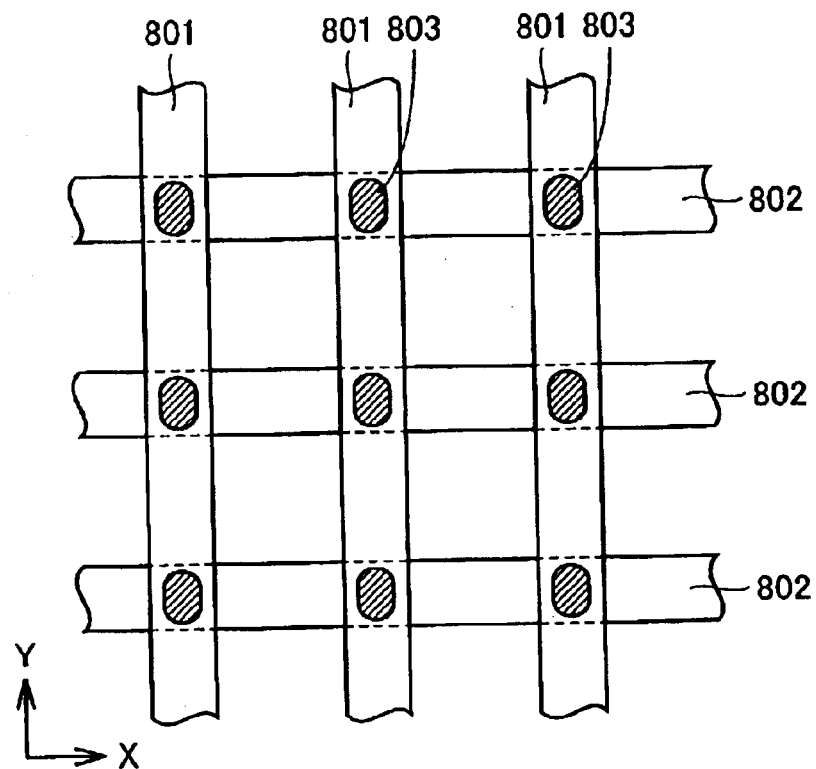
FIG. 15 shows a two-dimensional arrangement of memory cells in MRAM.
Figure 16:
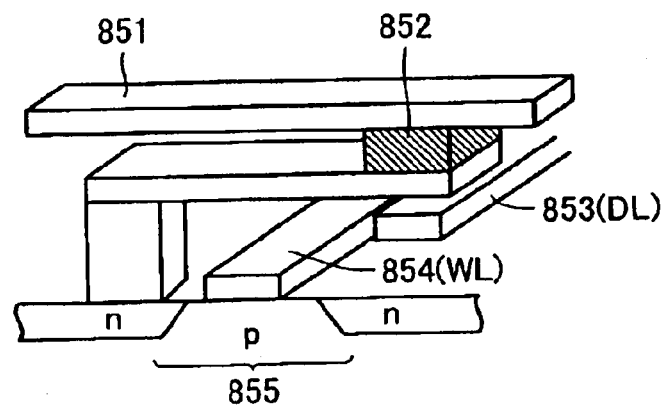
FIG. 16 schematically shows the conventional MRAM memory cell.
Figure 17:
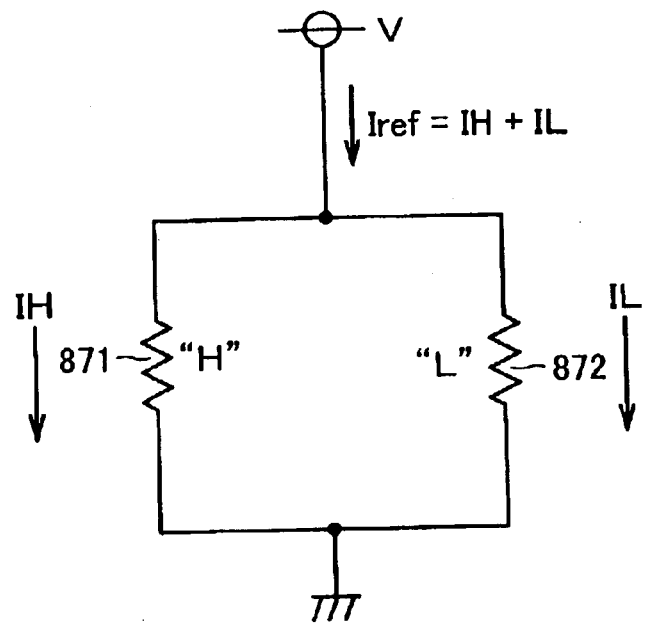
FIG. 17 is the first view for illustrating a problem occurring when a reference signal is produced using a plurality of TMR elements as reference cells.
Figure 18:
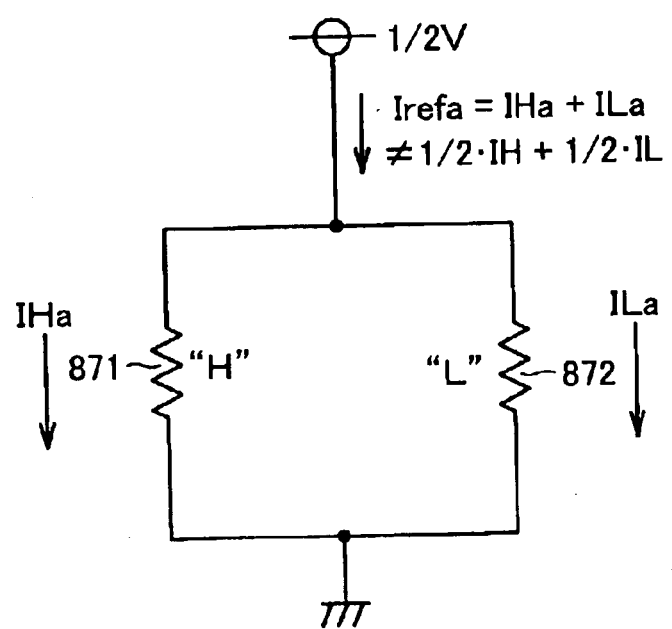
FIG. 18 is the second view for illustrating a problem occurring when a reference signal is produced using a plurality of TMR elements as reference cells.
Figure 19:
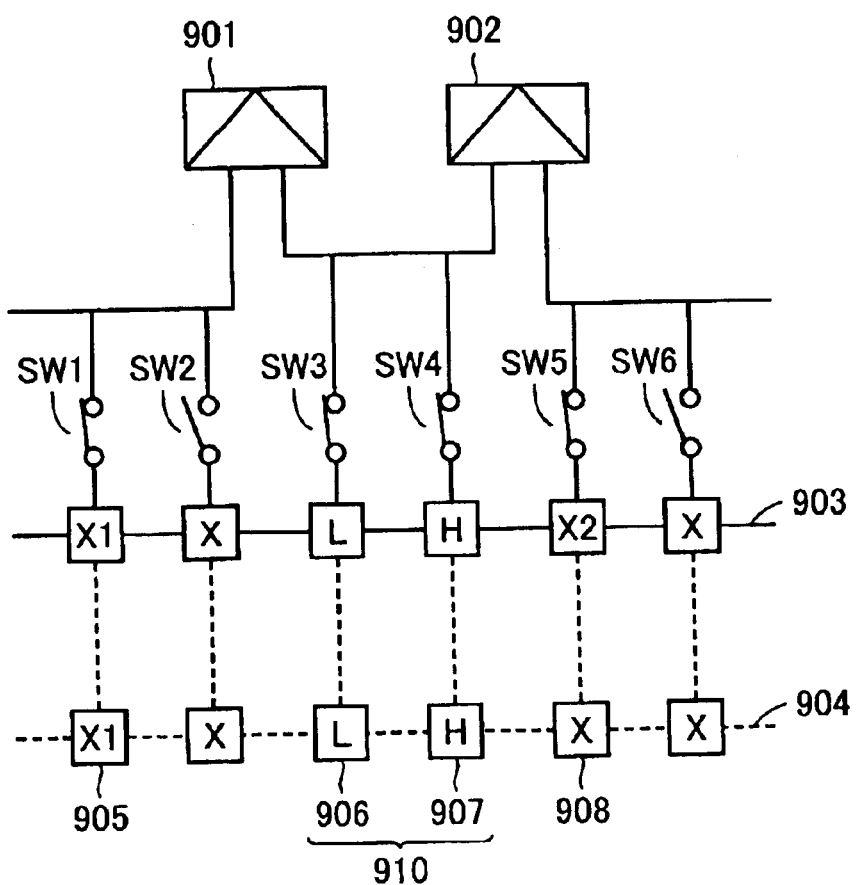
FIG. 19 illustrates an example where a reference signal is produced by applying the same voltage to the reference cell and to both ends of a TMR element in each of memory cells to be read out.

FIG. 12 illustrates an example where TMR elements in reference cells have the same set value and current IH, IL are applied to the reference cells.

Referring to FIG. 12, this can be achieved by adjusting the gate width or the gate length such that transistors T1$b$, T2$b$ of reference memory cells 102$b$, 103$b$ have conduction resistances R1$b$, R2$b$ different from those of the other memory cells.

For instance, reference memory cells 102$b$, 103$b$ and data-storing memory cells 126, 129 all have the same size of TMR elements. Then, the gate of one of transistors T1$a$, T2$a$ is set to have the same size as that of the transistors in storing memory cells 126, 129 while the other gate is made narrower compared to that of the transistors in storing memory cells 126, 129.

If the same data is held in the TMR elements here, the resistance value of the whole of the reference memory cells with the gates having a reduced width is larger than the resistance value of the memory cells with the gates having an original not-reduced width. Thereafter, data corresponding to resistance Rmin of a TMR element is written into both reference memory cells 102$b$ and 103$b$.

At that time, by adjusting the values of conduction resistances R1$b$, R2$b$ corresponding to transistors having the width-reduced gates, the resistance value of the whole of the reference cells is set to be equal to the increased resistance of the data-storing memory cell. Accordingly, current IL can be applied to reference memory cell 103$a$ while current IH can be applied to reference memory cell 103$b$.

This also allows reference current Iref to be an intermediate value between current value IH obtained when "H" data is held in the data-storing memory cell and current value IL when "L" is held therein. It is also sufficient here to store only one type of the logic values into the resistance elements of the reference memory cells.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device using a resistive element storing data in accordance with a change in a resistance value, comprising:

a memory array, said memory array including
a plurality of bit lines,
a plurality of memory cells storing externally-applied data, a plurality ones of said memory cells being connected to each of said bit lines, and
a plurality of reference memory cells holding a reference value for discriminating data to be read from said plurality of memory cells, each of said reference memory cells being connected to each of said bit lines;
a selection circuit selecting at least one of said plurality of memory cells as a selected cell in accordance with an input address, and selecting at least two of said plurality of reference memory cells connected to a bit line different from a bit line to which said selected cell is connected, as a plurality of selected reference cells corresponding to said selected cell; and
a read control circuit performing detecting operation of read data of said selected cell in accordance with current flowing in the whole of said plurality of selected reference cells, said read control circuit equally holding a voltage applied to each of said plurality of selected reference cells and a voltage applied to said selected cell at said detecting operation.

2. The non-volatile memory device according to claim 1, wherein said read control circuit derives a reference current value that is intermediate between a first current value obtained when a first logic value is held in said selected cell and a second current value obtained when a second logic value different from the first logic value is held in said selected cell from the current flowing in the whole of said plurality of selected reference cells, and compares said reference current value with a value of current flowing in said selected cell.

3. The non-volatile memory device according to claim 2, wherein a first reference cell of said plurality of selected reference cells has a first resistive element holding said first logic value, and
a second reference cell of said plurality of selected reference cells has a second resistive element holding said second logic value.

4. The non-volatile memory device according to claim 2, wherein a first reference cell of said plurality of selected reference cells has a resistance value that is intermediate between a resistance value obtained when said first logic value is held in said memory cell and a resistance value obtained when said second logic value is held in said memory cell.

5. The non-volatile memory device according to claim 2, wherein first and second reference cells of said plurality of selected reference cells have resistance values corresponding to a resistance value obtained when said first logic value is held in said memory cell and a resistance value obtained when said second logic value is held in said memory cell, respectively;
said first reference cell has
a first resistive element holding a third logic value, and
a first switch element connected in series with said first resistive element, a sum of a resistance value of said first resistive element and a resistance value of said first switch element being a resistance value corresponding to said first logic value; and
said second reference cell has a second resistive element holding said third logic value, and a second switch element connected in series with said second resistive element, a sum of a resistance value of said second resistive element and a resistance value of said second switch element being a resistance value corresponding to said second logic value.

6. The non-volatile memory device according to claim 2, wherein each of first and second reference cells of said plurality of selected reference cells has a resistance value corresponding to an intermediate value between said first logic value and said second logic value;

said first reference cell has a first resistive element holding a third logic value, and a first switch element connected in series with said first resistive element, a sum of a resistance value of said first resistive element and a resistance value of said first switch element being a resistance value corresponding to said intermediate value; and said second reference cell has a second resistive element holding said third logic value, and a second switch element connected in series with said second resistive element, a sum of a resistance value of said second resistive element and a resistance value of said second switch element being a resistance value corresponding to said intermediate value.

7. The non-volatile memory device according to claim 1, wherein a first bit line of said plurality of bit lines is connected to said selected cell, and a second bit line of said plurality of bit lines is connected to one of said plurality of selected reference cells and arranged in parallel and adjacent to said first bit line.

8. The non-volatile memory device according to claim 1, wherein a first bit line of said plurality of bit lines is connected to said selected cell, and a second bit line of said plurality of bit lines is connected to one of said plurality of selected reference cells and arranged on either one of an extended line of said first bit line and a line parallel to said extended line.

9. The non-volatile memory device according to claim 1, wherein a first bit line of said plurality of bit lines is connected to said selected cell;

a second bit line of said plurality of bit lines is connected to one of said plurality of selected reference cells; and said read control circuit includes a first sense amplifying circuit, and a connection circuit connecting said first and second bit lines to said first sense amplifying circuit in accordance with an address signal.

10. The non-volatile memory according to claim 9, wherein said second bit line is connected to one of said plurality of selected reference cells and arranged in parallel and adjacent to said first bit line, and said connection circuit interchanges said first and second bit lines for connection to said first sense amplifying circuit, when the address signal is input that selects one of memory cells connected to said second bit line and a reference memory cell connected to said first bit line as said selected cell and said selected reference cell, respectively.

11. The non-volatile memory device according to claim 9, wherein said second bit line is connected to one of said plurality of selected reference cells and arranged on either one of an extended line of said first bit line and a line parallel to said extended line, and said connection circuit interchanges said first and second bit lines for connection to said first sense amplifying circuit, when the address signal is input that selects one of memory cells connected to said second bit line and a reference memory cell connected to said first bit line as said selected cell and said selected reference cell, respectively.

12. The non-volatile memory device according to claim 1, wherein each of said plurality of memory cells has a magneto resistive element magnetized in a direction in accordance with storage data, as said resistive element, and said magneto resistive element has an electric resistance varying in accordance with the direction of magnetization.

* * * * *